(12) United States Patent
Gustin et al.

(10) Patent No.: US 6,984,578 B2
(45) Date of Patent: Jan. 10, 2006

(54) METHOD FOR THE PRODUCTION OF AN INTEGRATED CIRCUIT

(75) Inventors: Wolfgang Gustin, Dresden (DE); Kae-Horng Wang, Dresden (DE); Matthias Kroenke, Dresden (DE)

(73) Assignee: Infineon Technologies AG, Munich (DE)

(*) Notice: Subject to any disclaimer, the term of this patent is extended or adjusted under 35 U.S.C. 154(b) by 16 days.

(21) Appl. No.: 10/476,355

(22) PCT Filed: Apr. 11, 2002

(86) PCT No.: PCT/EP02/04067
§ 371 (c)(1),
(2), (4) Date: Oct. 30, 2003

(87) PCT Pub. No.: WO02/089202
PCT Pub. Date: Nov. 7, 2002

(65) Prior Publication Data
US 2004/0147107 A1 Jul. 29, 2004

(30) Foreign Application Priority Data
Apr. 30, 2001 (DE) ................ 101 20 929

(51) Int. Cl.
*H01L 21/4763* (2006.01)
(52) U.S. Cl. .................... 438/620
(58) Field of Classification Search ........... 438/618, 438/620, 637, 717, 233, 279, 640
See application file for complete search history.

(56) References Cited

U.S. PATENT DOCUMENTS 5,206,187 A * 4/1993 Doan et al. ............... 438/618
5,498,570 A 3/1996 Becker ..................... 437/187
5,578,524 A 11/1996 Fukase et al. ............ 437/195

(Continued)

*Primary Examiner*—Craig A. Thompson
*Assistant Examiner*—Jennifer M Dolan
(74) *Attorney, Agent, or Firm*—Brinks Hofer Gilson & Lione

(57) ABSTRACT

The invention relates to a method for the production of an integrated circuit, comprising the following steps: a substrate (1) is provided with at least one first, second and third gate stack (GS1, GS2, GS3) of approximately the same height surface of said substrate, a common active area (60) being provided on the surface of the substrate in said substrate (1) between the first and second gate stack (GS1, GS2); a first insulating layer (70) is provided in order to cover the embedding of the first second and third gate stack (GS1, GS2, GS3); the upper side of a gate connection (20) of the third gate stack (GS3) is uncovered; a second insulating layer (80) is provided in order to cover the upper side of a gate connection (20); a mask (M2) is provided on the resulting structure having a first opening (12*a*) above the uncovered upper side of the gate connection (20) of the third gate stack (GS 3), a second opening (F2*b*) above the substrate (1) between the third and second gate stack (GS3, GS2) and a third opening (F2*c*) above the common active area (60), partially overlapping the first and second gate stack (GS1, GS2), and simultaneously forming a first, second and third contact hole (KB, KS, KG) using said mask (32) in an etching process, the first contact hole (KB) uncovering the common active area (60) on the surface of the substrate between the first and second gate stack (GS1, GS2), the second contact hole (KS) uncovering the surface of the substrate between the second and third gate stack (GS2, GS2) and the third contact hole (KG) uncovering the upper side of the gate connection (20) of the third gate stack (GS3).

8 Claims, 6 Drawing Sheets

U.S. PATENT DOCUMENTS

| | | | | |
|---|---|---|---|---|
| 5,972,757 A | * | 10/1999 | Ema | 438/283 |
| 6,104,052 A | * | 8/2000 | Ozaki et al. | 257/296 |
| 6,165,878 A | | 12/2000 | Haruhana et al. | 438/586 |
| 6,207,571 B1 | | 3/2001 | Juengling et al. | 438/692 |
| 6,235,620 B1 | * | 5/2001 | Saito et al. | 438/586 |
| 6,337,278 B1 | | 1/2002 | Butler | 438/689 |

* cited by examiner

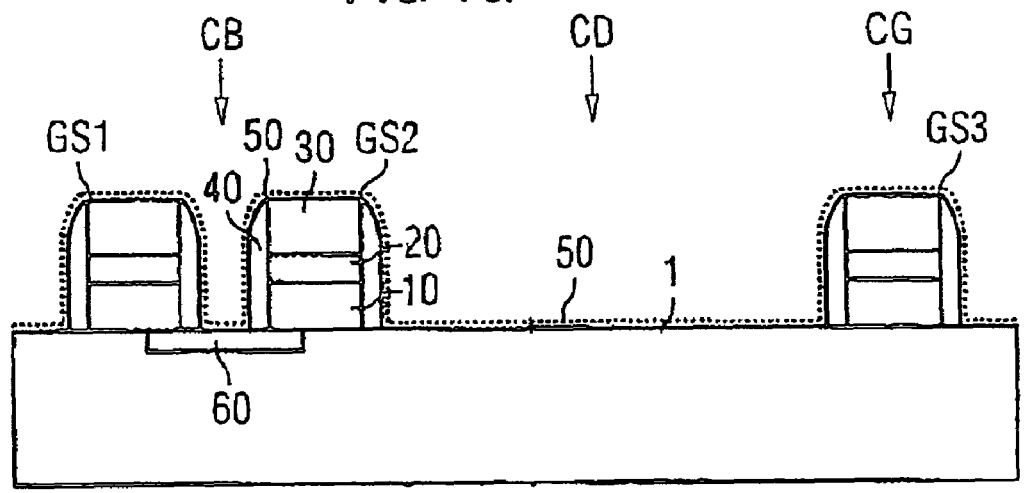
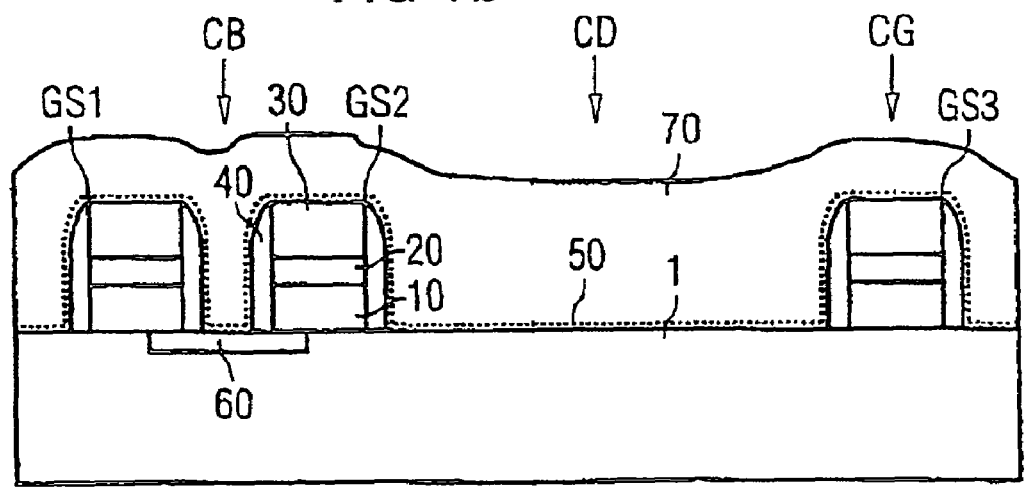

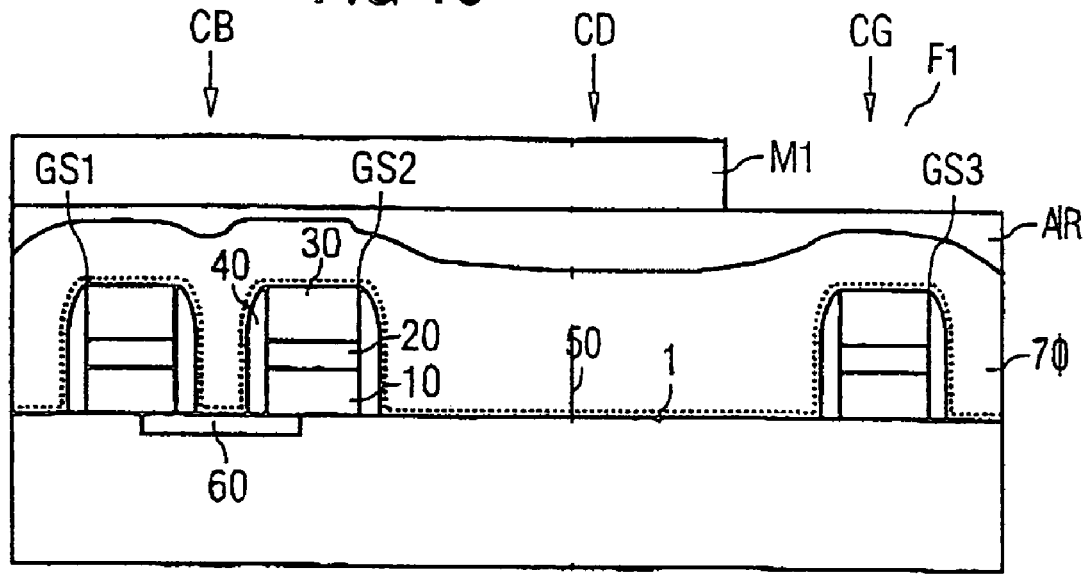
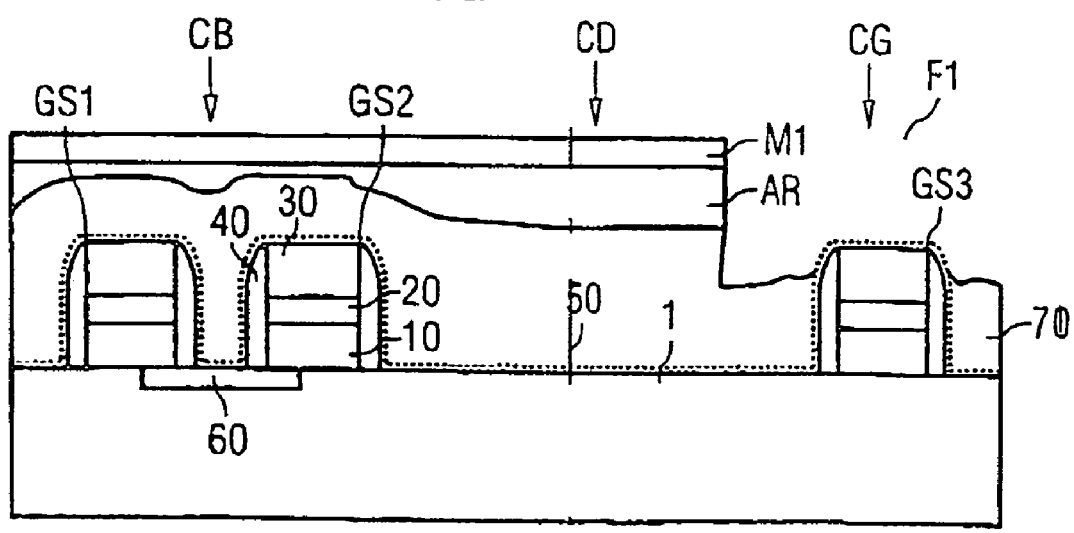

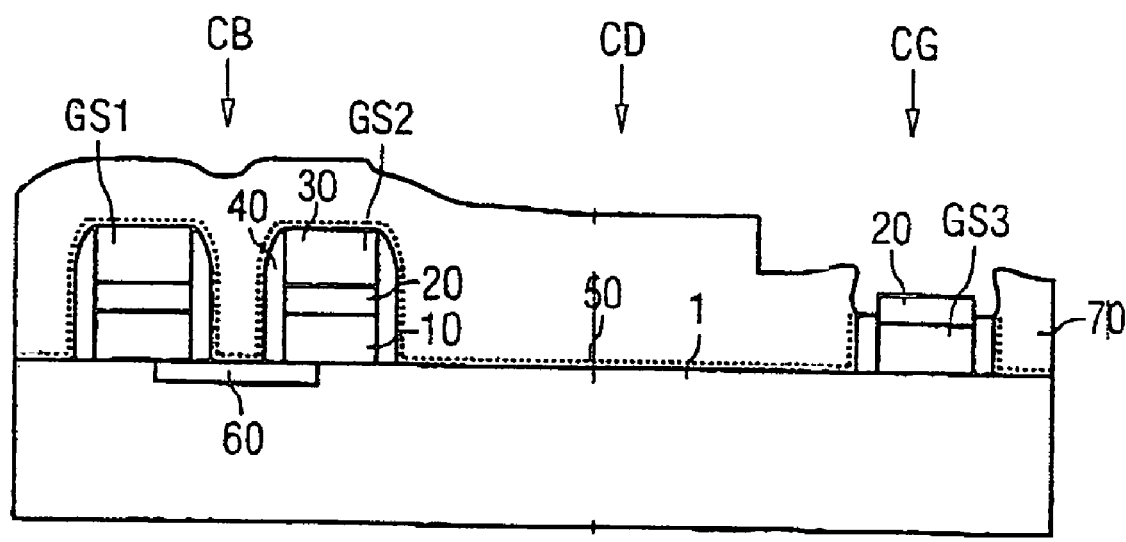
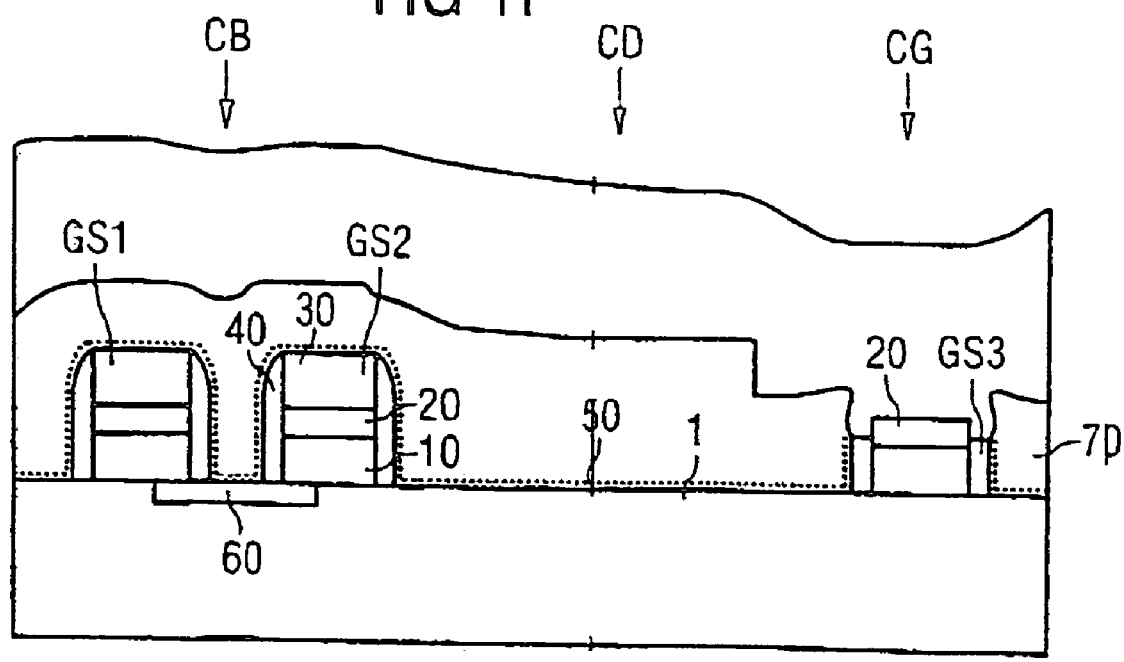

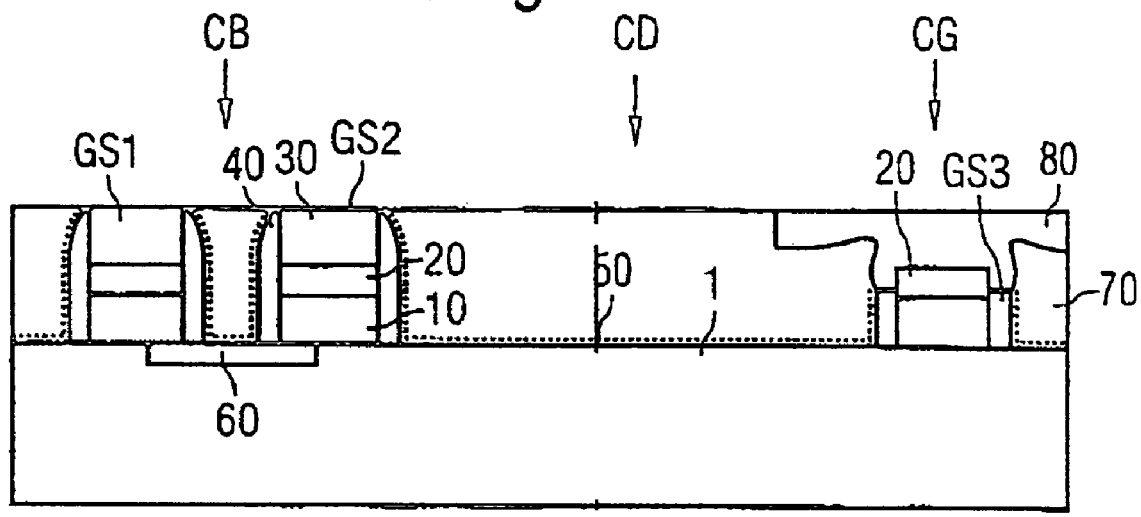
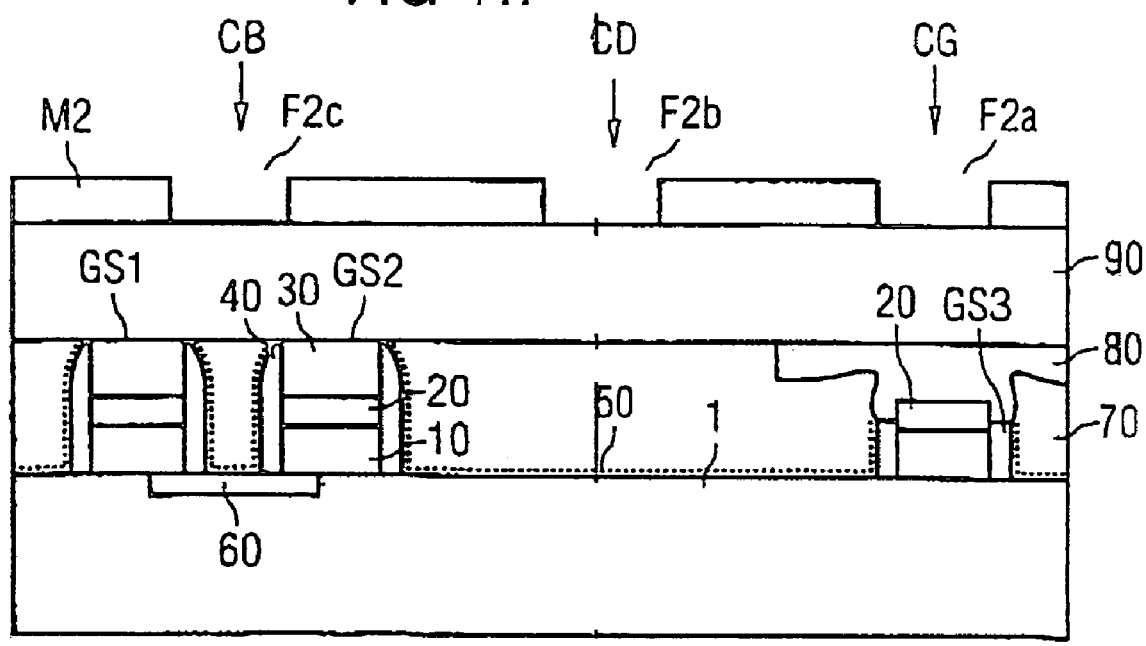

METHOD FOR THE PRODUCTION OF AN INTEGRATED CIRCUIT

CROSS-REFERENCE TO RELATED APPLICATIONS

This application claims priority of internatinal application number PCT/EP02/04067.

BACKGROUND OF THE INVENTION (1) Field of the Invention

The present invention relates to a method for the production of an integrated circuit.

(2) Description of Related Art

Although applicable in principle to any desired integrated circuits, the present invention and the problem area on which it is based are explained with regard to integrated memory circuits in silicon technology. In the production of integrated circuits, in particular integrated semiconductor memory circuits, it is necessary to produce different types of contacts. In this case, it is desirable to produce these different contacts with the fewest possible lithography planes and etching steps in order to ensure a high alignment accuracy.

FIGS. 2a, b are diagrammatic illustrations of successive method stages of a known method for the production of an integrated circuit in silicon technology.

FIG. 2a shows an exemplary semiconductor substrate 1 with a memory cell arrangement that is not illustrated in any further detail. 60 designates an active region, for example a common source/drain region of two memory cells. GS1, GS2, GS3 are three gate stacks which are constructed from a polysilicon layer 10 with underlying gate oxide layer (not illustrated), a silicide layer 20 and a silicon nitride layer 30. IS is an insulation layer, for example made of silicon dioxide, in which three different contact types are to be formed, namely a first (critical) contact type CB, which makes electrical contact with the active region 60 between the two gate stacks GS1, GS2, a second contact type CD, which makes electrical contact with a further active region (not illustrated) in the substrate region between the gate stacks GS2, GS3, and a third contact type CG, which makes electrical contact with the gate terminal 20 of the third gate stack GS3.

Usually, the contact hole for the critical contact CB is etched separately, and then the two non-critical contact holes for the contacts CS and CG are etched simultaneously. This requires two lithography planes, which means that both lithography planes have to be aligned with the gate contact plane. Alignment fluctuations JS may occur as a result of this.

Since the metal plane M is subsequently aligned with CB (it cannot simultaneously be aligned with CD, CG as well), critical overlay tolerances OT result, as illustrated in FIG. 2b. In the worst case, such overlay tolerances OT may lead to short circuits in the metalization plane M (M0 to CD/CG).

The two planes CB and CD, CG cannot simply be combined since, during the etching, firstly silicon oxide IS and then silicon nitride 30 have to be etched. The silicon nitride etching would also remove the side insulation of the gate stacks (not shown in FIG. 2) and thus create a short circuit between the gate terminal and the contact CB.

BRIEF SUMMARY OF THE INVENTION

The object of the present invention is to specify a method which affords the possibility of simultaneously gently etching a plurality of different contacts below the first metalization plane.

According to the invention, this object is achieved by means of the production method specified in claim 1.

The advantages of the method according to the invention reside in particular in the fact that a critical lithography plane is obviated since all three contact hole types can be processed simultaneously. In this case, the subsequent metalization plane have alignment directly with all three contact hole types simultaneously. In comparison with the previous alignment: M0 to CB, CB to GC and GC to CD, this invention can avoid many alignment faults between M0 and CD.

Since, on the CG contact, the silicon nitride cap is removed early with the aid of the non critical lithography plane, a silicon oxide etching with a soft landing can be used simultaneously for all the contact holes during the contact hole etching.

Alignment tolerance is additionally obtained since the CG contacts are permitted to land in a wider region than hitherto on the gate terminal. Hitherto, in the case of a poorly aligned CG contact, the silicon nitride sidewall spacer would have been attacked by the concluding silicon nitride cap etching step.

As a result of this, it is possible to reduce the size of the entire cell array by virtue of the alleviation of the contact alignment.

In particular, all the different contacts can be simultaneously gently etched simultaneously by means of the same etching method known from the CB etching.

Advantageous developments and improvements of the production method specified in claim 1 are found in the subclaims.

In accordance with one preferred development, the uncovering of the top side of a gate terminal of the third gate stack is effected by means of the following steps: provision of a further mask on the first insulation layer, which has a fourth opening above the third gate stack; uncovering of the top side of the third gate stack by means of an etching process using the further mask; removal of the first mask; selective etching of the third gate stack until the top side of the gate terminal is uncovered.

In accordance with a further preferred development, the first and second insulation layers are planarized until the top sides of the first and second gate stacks are uncovered.

In accordance with a further preferred development, a third insulation layer is provided below the mask.

In accordance with a further preferred development, the mask is a hard mask.

In accordance with a further preferred development, the etching process for the simultaneous formation of a first, second and third contact hole anisotropically etches the insulation layers selectively with respect to the uncovered material of the gate stacks.

In accordance with a further preferred development, on the substrate with the gate stacks, a liner layer is provided as an etching stop for the etching process for the simultaneous formation of a first, second and third contact hole and is removed after the etching process for the simultaneous formation of a first, second and third contact hole in a separate etching process.

In accordance with a further preferred development, the openings are provided with a taper, that is to say in such a way that they narrow downwardly. The advantage of the taper resides in the fact that even smaller holes than would usually be possible with critical lithography can be exposed, or that larger holes can be exposed, which then become smaller by virtue of the taper. The corresponding lithography can thus be carried out in a stabler process range.

An exemplary embodiment of the invention is illustrated in the drawings and explained in more detail in the description below.

BRIEF DESCRIPTION OF THE SEVERAL VIEWS OF THE DRAWINGS

In the figures:

FIGS. 1a–j show diagrammatic illustrations of successive method stages of a method for the production of an integrated circuit in silicon technology as an embodiment of the present invention.

In the figures, identical reference symbols designate identical or functionally identical constituent parts.

DETAILED DESCRIPTION OF THE INVENTION

Figure 1I:
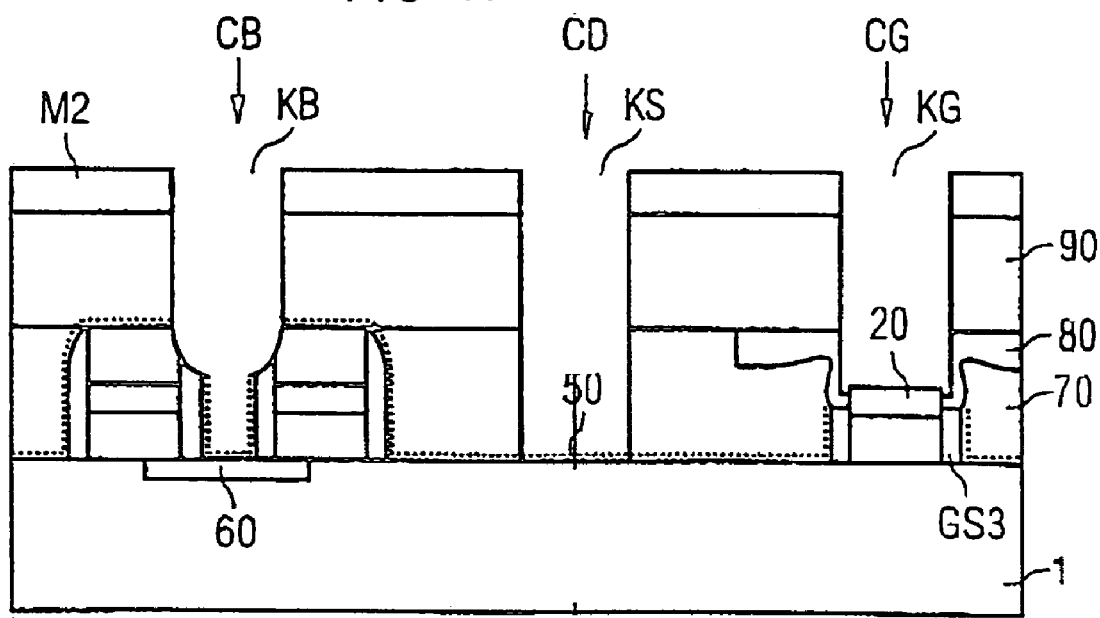

FIGS. 1a–j are diagrammatic illustrations of successive method stages of a method for the production of an integrated circuit in silicon technology as an embodiment of the present invention.

In accordance with FIG. 1a, a substrate 1 with a memory cell arrangement (not shown) is provided.

Reference symbol 60 designates an active region, for example a common source/drain region of two memory cells. Situated above the active region 60 are adjacent gate stacks GS1 and GS2, which are at a critical distance from one another. A third gate stack GS3 is furthermore provided on the substrate 1, which third gate stack is at a significantly larger and non-critical distance from the other two gate stacks GS1, GS2.

The gate stacks GS1, GS2, GS3 are all of approximately the same height and have the same construction, namely a lower layer made of polysilicon with an underlying gate oxide layer (not depicted), a middle layer 20 made of silicide and an upper layer 30 made of silicon nitride. The sidewall spacers 40 are likewise produced from silicon nitride. CB, CS and CG designate positions at which the different electrical contacts are to be produced, as explained in the introduction.

In a first step, in this embodiment, a liner layer 50 is deposited conformally, which liner layer is a barrier against the diffusion of boron and phosphorus and is as an etching stop for a later silicon oxide etching. By way of example, silicon nitride or silicon oxynitride is suitable as the liner layer 50.

After the liner deposition, a silicon oxide layer, e.g. a BPSG layer (borophosphosilicate glass), which is designated by reference symbol 70, is deposited over the resulting structure. This BPSG layer 70 is caused to flow in a subsequent heat treatment, so that it does not leave behind any free spaces or voids in particular between the closely adjacent gate stacks GS1, GS2. This leads to the method stage shown in FIG. 1b.

In a subsequent method step, a planarizing ARC coating (anti-reflective coating) is spun on, which levels out the remaining unevennesses (see FIG. 1b) of the surface of the BPSG 70. If this is insufficient for the subsequent lithography, a planarization, for example by means of chemical mechanical polishing (CMP), may also be effected after the heat treatment of the BPSG layer 70.

A photoresist layer for a mask M1 is subsequently applied and patterned in such a way that an opening F1 is present above the third gate stack GS3. The size of the opening F1 is non critical and may go beyond the dimensions of the third gate stack GS3. The state after exposure and development of the resist of the mask M1 is shown in FIG. 1c.

In this respect, it should be noted that given a sufficient size of the lithography process window, the deposition of the ARC coating may possibly even be dispensed with.

With reference to FIG. 1d, the surface of the third gate stack GS3 and the periphery comprising the silicon oxide layer 70 are then uncovered in accordance with the size of the window F1. For this purpose, the ARC coating AR and the silicon oxide layer 70 are removed by means of a suitable etching process, for example a reactive ion etching. Afterward, the residues of the mask M1 and the ARC coating AR are removed, so that the silicon oxide layer 70 forms a mask for a subsequent etching of the third gate stack GS3. By means of this subsequent etching, for example by wet-chemical etching using hot phosphoric acid, the surface of the third gate stack GS3 is removed selectively with respect to the silicon oxide and the silicide layer 20 of the third gate stack GS3 is uncovered at the top side. This process stage is shown in FIG. 1e. The corresponding contact CG is intended to make electrical contact with said silicide layer 20. The etching time must be dimensioned in such a way that parts of the sidewall spacer 40 still remain.

In the next method step, a further intermediate oxide, e.g. a TEOS layer 80, is deposited on the resulting structure, which leads to the process stage shown in FIG. 1f.

The silicon oxide layers 70 and 80 are then planarized in such a way that the top side of the gate stacks GS1, GS2 is uncovered. This planarization is likewise expediently effected by means of a chemical mechanical polishing process. The resulting structure has an essentially planar surface, as shown in FIG. 1g.

Afterward, a further intermediate oxide (e.g. TEOS), designated by reference symbol 90, is deposited on the resulting structure. This intermediate oxide serves as a spacer between the substrate and the metalization M2 in order to keep down capacitive couplings.

A hard mask, for example made of polysilicon, is then deposited on the intermediate oxide 90 and is patterned photolithographically in a customary manner.

The resulting state is shown in FIG. 1h, where F2a, F2b, F2c designates respective openings in the hard mask M2.

The first opening F2a lies above the uncovered top side of the gate terminal 20 of the third gate stack GS3. The second opening F2b lies above the substrate 1 between the third and second gate stacks GS3 and GS2. The third opening F2c lies above the active region 60 and partially overlaps the first and second gate stacks GS1, GS2.

With reference to FIG. 1i, the contact holes KB, KS, KG for the contacts CB, CS and CG, respectively, are then etched reactively. What is expedient in this case is that all the different contact hole types KB, KS, KG can be patterned simultaneously. In this case, an etching method is used which anisotropically etches the intermediate oxides selectively with respect to the silicon nitride, silicon oxynitride or gate material and the polysilicon. This ensures that the two deep contact holes KB, KS are etched through as far as the liner layer 50 and the less deep contact hole KG is etched through as far as the gate terminal 20.

Figure 1J:
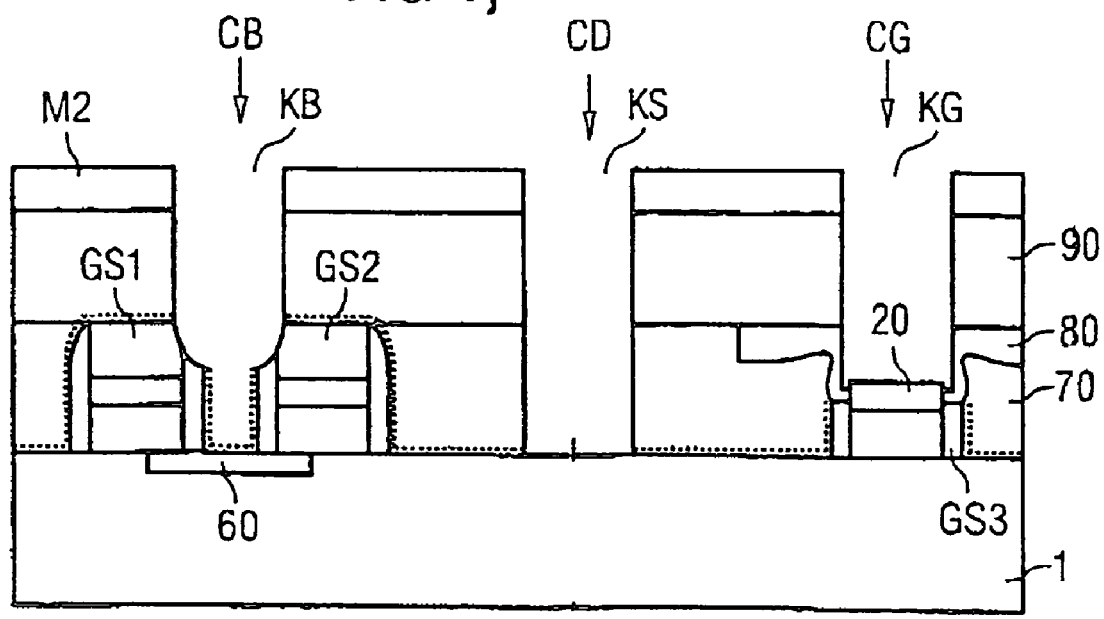
Figure 2A:
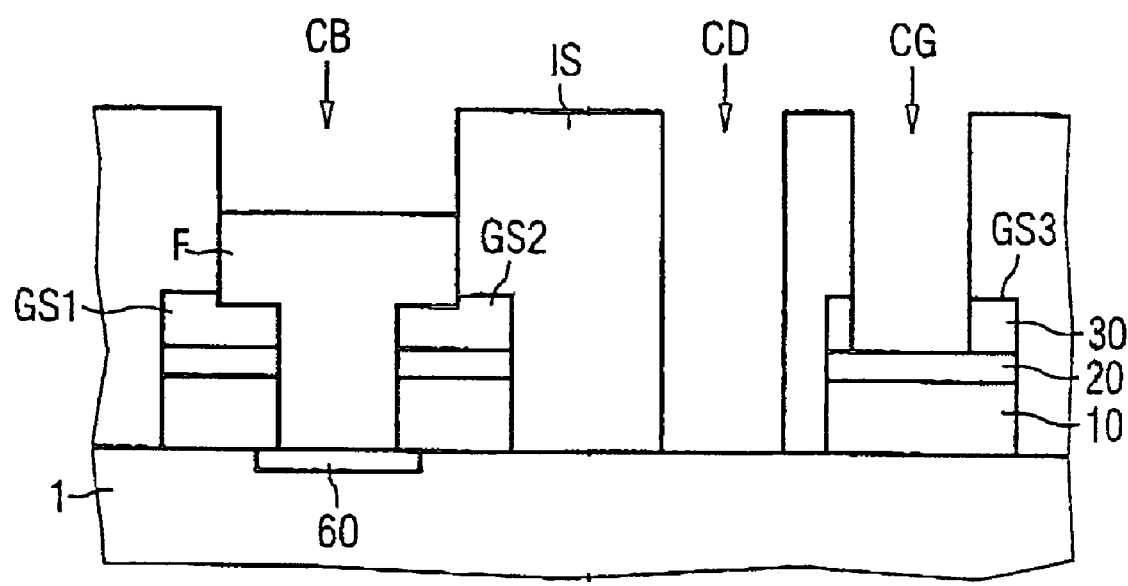
FIGS. 2a, b show diagrammatic illustrations of successive method stages of a known method for the production of an integrated circuit in silicon technology.
Figure 2B:
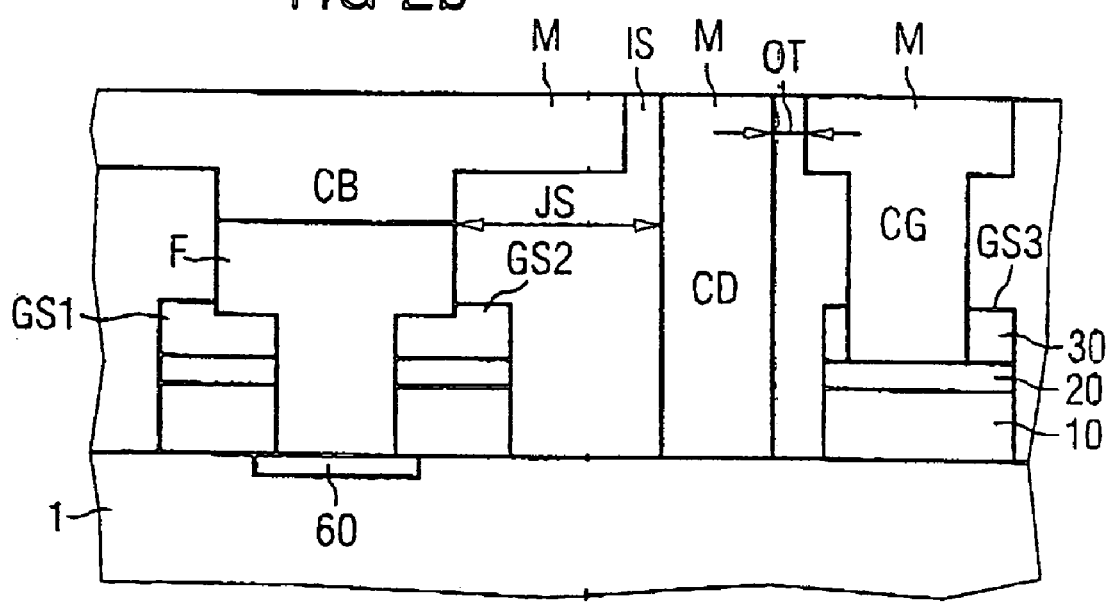

With reference to FIG. 1j, the liner layer 50 is subsequently also etched through in a separate etching step, so that an electrical contact between the metalization plane and the structures present at the contact hole bottom can then be produced in a later method step.

The finally resulting structure is illustrated in FIG. 1j. After the method stage shown in FIG. 1j, the metalization plane is applied and patterned in a known method procedure.

Although the present invention has been described above on the basis of a preferred exemplary embodiment, it is not restricted thereto, but rather can be modified in diverse ways.

In particular, the selection of the layer materials is only by way of example and can be varied in many different ways.

It goes without saying that, instead of the abovementioned hard mask on the intermediate oxide, the formation of a suitable photoresist mask is likewise conceivable, in principle. However, through the introduction of the hard mask, the aspect ratio during the subsequent contact hole etching is reduced in comparison with having to etch the contact holes through thick photoresist.

LIST OF REFERENCE SYMBOLS

1 Substrate
GS1, GS2, GS3 Gate stack
60 active region (source, drain)
10 Polysilicon with underlying gate oxide
20 Silicide
30 Silicide nitride
40 Silicon nitride sidewall spacer
50 Liner made of silicon nitride or silicon oxynitride
70 first silicon oxide
80 second silicon oxide
90 third silicon oxide
CB, CD, CG location for bit line, substrate and word line contact
KB, KS, KG contact hole for bit line, substrate and word line contact
F1, F2a, F2b, F2c Opening
M1, M2 Masks
IS Insulation layer
F Polysilicon filling
M Metal plane
OT Overlay tolerance
JS Alignment fluctuation

What is claimed is:

1. A method for production of an integrated circuit, comprising:
    providing at least one first gate stack, at least one second gate stack and at least one third gate stack on a surface of a substrate, wherein each of the first, second and third gate stacks is approximately the same height and includes a gate terminal;
    providing a common active region in the substrate at the surface of the substrate and between the first and second gate stacks;
    insulating the gate terminal of each of the first, second and third gate stacks with an encapsulation formed around each of the first, second and third gate stacks;
    providing a first insulating layer on the substrate for embedding the first, second and third gate stacks;
    providing a first mask on the first insulation layer, wherein the first insulation layer includes a first opening located above the third gate stack;
    uncovering the encapsulation formed around the third gate stack at a top side of the third gate stack by etching using the first mask;
    removing the first mask;
    selectively etching the uncovered encapsulation at the top side of the third gate stack with respect to the first insulation layer until a top side of the gate terminal of the third gate stack is uncovered;
    providing a second insulation layer on the substrate including the first insulation layer and the uncovered top side of the gate terminal of the third gate stack for covering the uncovered top side of the gate terminal of the third gate stack;
    providing a second mask on the substrate including the second insulating layer, wherein the second mask includes a second opening located above the top side of the gate terminal of the third gate stack, a third opening located between the third and second gate stacks and a fourth opening located above the common active region, partially overlapping the first and second gate stacks; and
    simultaneously forming a first contact hole, a second contact hole and a third contact hole by etching using the second mask, wherein the first and second insulation layers are selectively etched with respect to the encapsulations of the first, second and third gate stacks, the first contact hole uncovering the common active region at the surface of the substrate between the first and second gate stacks, the second contact hole uncovering the surface of the substrate between the second and third gate stacks and the third contact hole uncovering the top side of the gate terminal of the third gate stack.

2. The method as recited in claim 1, wherein, before providing the second mask, the first and second insulation layers are planarized until top sides of the first and second gate stacks are uncovered.

3. The method as recited in claim 1, wherein a third insulation layer is provided below the second mask.

4. The method as recited in claim 1, wherein the second mask is a hard mask.

5. The method as recited in claim 1, wherein the etching performed for simultaneously forming the first, second and third contact holes is anisotropic.

6. The method as recited in claim 1, further comprising providing a liner layer on the substrate including the first, second and third gate stacks, wherein the liner layer functions as an etching stop when performing the etching for simultaneously forming the first, second and third contact holes, and is removed in a separate etching process after the etching for simultaneously forming the first, second and third contact is complete.

7. The method as recited in claim 1, wherein the second, third and fourth openings are provided with a downwardly narrowing taper.

8. The method as recited in claim 1, wherein a further active region is uncovered at the surface of the substrate through the second contact hole.

* * * * *